United States Patent
De Coster et al.

(10) Patent No.: US 6,746,935 B2
(45) Date of Patent: Jun. 8, 2004

(54) MOS TRANSISTOR IN AN INTEGRATED CIRCUIT AND ACTIVE AREA FORMING METHOD

(75) Inventors: Walter De Coster, Saint Nazaire les Eymes (FR); Meindert Lunenborg, Crolles (FR); Alain Inard, Saint Nazaire les Eymes (FR); Jos Guelen, Malden (NL)

(73) Assignees: STMicroelectronics S.A., Gentilly (FR); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/823,274

(22) Filed: Mar. 29, 2001

(65) Prior Publication Data

US 2002/0076868 A1 Jun. 20, 2002

(30) Foreign Application Priority Data

Mar. 31, 2000 (FR) .......................... 00 04174

(51) Int. Cl.⁷ .............................. H01L 21/76
(52) U.S. Cl. ................... 438/433; 438/296; 438/424
(58) Field of Search ................ 438/196, 207, 438/218, 219, 221, 294, 295, 296, 353, 355, 359, 391, 404, 422, FOR 260, FOR 222, FOR 227, 433

(56) References Cited

U.S. PATENT DOCUMENTS

| | | | |
|---|---|---|---|
| 3,430,112 A | 2/1969 | Hilbourne | 317/235 |
| 4,282,539 A | 8/1981 | Schrader | 357/23 |
| 5,132,755 A | 7/1992 | Ueno | 357/23.1 |
| 5,357,137 A | 10/1994 | Hayama | 257/396 |
| 5,424,571 A | 6/1995 | Liou | 257/344 |
| 5,777,370 A | * 7/1998 | Omid-Zohoor et al. | 257/374 |
| 5,950,090 A | * 9/1999 | Chen et al. | 438/296 |
| 5,953,621 A | * 9/1999 | Gonzalez et al. | 438/424 |
| 5,994,202 A | * 11/1999 | Gambino et al. | 438/433 |
| 6,022,781 A | * 2/2000 | Noble et al. | 438/296 |
| 6,077,748 A | * 6/2000 | Gardner et al. | 438/296 |
| 6,235,596 B1 | * 5/2001 | Liao | 438/289 |
| 6,261,924 B1 | * 7/2001 | Mandelman et al. | 438/430 |
| 6,281,562 B1 | * 8/2001 | Segawa et al. | 257/510 |

FOREIGN PATENT DOCUMENTS

| | | | |
|---|---|---|---|
| DE | 2641334 A1 | 3/1978 | |
| JP | 05029310 A | * 2/1993 | ......... H01L/21/316 |

OTHER PUBLICATIONS

Tang et al., "Intrinsic MOSFET Parameter Fluctuations Due to Random Dopant Placement," *IEEE*, 5(4): pp. 369–376, Dec., 1997.

* cited by examiner

*Primary Examiner*—Tom Thomas
*Assistant Examiner*—Paul E Brock, II
(74) *Attorney, Agent, or Firm*—Lisa K. Jorgenson; Robert Iannucci; Seed IP Law Group PLLC

(57) ABSTRACT

A method of forming an active area surrounded with an insulating area in a semiconductor substrate, including the steps of forming in the substrate a trench surrounding an active area; filling the trench with an insulating material to form an edge extending beyond the substrate surface at the periphery of the active area; forming a spacer at the periphery of said edge; and implanting a dopant, whereby the implantation in the area located under the spacer is less deep than in the rest of the active area.

3 Claims, 4 Drawing Sheets

MOS TRANSISTOR IN AN INTEGRATED CIRCUIT AND ACTIVE AREA FORMING METHOD

TECHNICAL FIELD

The present invention generally relates to integrated circuits on a semiconductor substrate including at least one component formed in an active area and more specifically to the forming of active areas surrounded with insulating areas. These insulating areas are obtained from trenches filled with an insulating material and each active area is intended for receiving a conductive layer insulated therefrom, for example a control gate of a device of transistor type. The device may be a MOS transistor formed by any known technology (MOS, CMOS, BiCMOS).

BACKGROUND OF THE INVENTION

FIG. 1 partially and schematically illustrates in a transversal cross-section view a semiconductor substrate 1 on which is formed an insulated conductive line. It is considered hereafter as a non-limiting example that this line is a gate electrode of a MOS transistor of lateral type.

In FIG. 1, substrate 1 includes an active area 5 delimited by an insulating area 2. Insulating area 2 has been formed by digging trenches into the substrate, then by filling them with an insulating material, typically silicon oxide ($SiO_2$). The filling is performed so that the insulating material overflows, as indicated by dotted line 6, with respect to the level defined by the substrate, whereby insulating area 2 has a top having a substantially planar surface at a level higher than the surface of the active area 5 thus defined, this top ending in a substantially vertical edge leading to active area 5. Such an insulating area structure 2 can be conventionally obtained in several ways, as will be discussed hereafter.

Insulating area 2 has, in contact with active area 5, an embattling area which, due to overetchings in subsequent steps of removal of various sacrificial insulating materials, will cause a depression 7 at the periphery of active area 5.

At the level of a gate area, a thin insulator layer 3 covers the upper surface of active area 5 as well as its peripheral portion exposed by depression 7. Layer 3 is covered with a layer 4 of a conductive material, typically polysilicon. Conductive material 4 passes over insulating area 2 and over active area 5, and fills depression 7. The filling of depression 7 by the gate material has disturbing effects. Indeed, because of the curvature exhibited on the edge of active area 5 by the gate material due to this depression, the distribution of the electric field in the channel area located at the edge of insulating area 2 is disturbed, which deteriorates, as will be seen hereafter, the transistor performances.

FIG. 2 illustrates in top view a MOS transistor of lateral type. In this case, FIG. 1 corresponds to a partial cross-section view along line A—A', limited by an area defined by the dotted lines. Active area 5 includes a channel area, located under a control gate 4 and, on either side of the gate, source and drain regions. The gate, drain, and source contacting points are underscored by hatched regions, the location of which is indifferent to the discussion of the present invention.

Depression 7 exhibited by insulating layer 2 is located over the entire periphery P of active area 5. The portions of periphery P underlying the gate are underscored by check patterns 8 and it can be considered that the MOS transistor of FIG. 2 is formed of two transistors: a central transistor with normal performances, having a planar gate parallel to the surface of substrate 1 and, on either side of the central transistor, a parasitic transistor with impaired performances located along insulating layer 2, having a non-planar gate extending over depression 7.

FIG. 3 shows the drain-source current Ids, in logarithmic coordinates as a function of gate-source voltage Vgs. Curve C1 corresponds to the central transistor and has a normal threshold voltage V1 and a normal leakage current I1off (current Ids for Vgs=0). Curve C2 corresponds to the parasitic transistor and has a decreased threshold voltage V2 and an increased leakage current I2off. Since the resulting MOS transistor has a characteristic corresponding to the sum of curves C1 and C2, its threshold voltage will also be lowered and, above all, its leakage current Ioff will be increased. This causes leakages, which are very disturbing, for example, in applications where the considered transistor belongs to a chip powered by a battery, as in portable phones, the battery being then likely to discharge more rapidly.

Further, it should be noted that the adverse effects of the parasitic transistor are all the more significant as active area 5 is narrow. Given the constant tendency of the semiconductor industry to reduce the sizes of transistors, the adverse effect of the parasitic transistor can only be enhanced, and the transistor can even stop existing if the gate width becomes to small, the resulting transistor being then only formed by the parasitic transistor.

SUMMARY OF THE INVENTION

An embodiment of the present invention provides a MOS transistor which avoids the disadvantages of prior art and has a non-impaired voltage threshold.

Another embodiment of the present invention provides a method of forming an active area in a semiconductor substrate enabling obtaining such a structure. The method forms an active area surrounded with an insulating area in a semiconductor substrate, including the steps of:

a) forming in the substrate a trench surrounding an active area;

b) filling the trench with an insulating material to form an edge extending beyond the substrate surface at the periphery of the active area;

c) forming a spacer at the periphery of said edge; and d) implanting a dopant, whereby the implantation in the area located under the spacer is less deep than in the rest of the active area.

According to an embodiment of the present invention, the spacer has a substantially vertical edge or has a bell shape, the thickness of which thins down as the distance from said edge increases.

According to an embodiment of the present invention, the implantation step is followed by a step of removal of the spacer.

According to an embodiment of the present invention, the step of removal of the spacer is preceded or followed by a step of implantation of another active area with a dopant of another conductivity type than that of the dopant used at step d).

According to an embodiment of the present invention, a step consisting of forming, at the surface of the active area, a protective coating, is provided between the trench filling step and spacer forming step c).

According to an embodiment of the present invention, the protective coating results from the thermal growth of a thin silicon oxide layer at the surface of the substrate.

According to an embodiment of the present invention, the spacer is made of silicon nitride.

According to an embodiment of the present invention, the spacer is made of polysilicon.

An embodiment of the present invention also provides a MOS transistor including a doped channel area adjacent to an insulating area, the dopants present in the portion of the channel area in contact with the insulating layer being closer to the surface than the dopants present in the rest of the channel area.

Another embodiment of the present invention includes an integrated circuit including such a transistor and a terminal including such an integrated circuit.

Many features and advantages of the present invention, will be discussed in detail in the following non-limiting description of specific embodiments in connection with the accompanying drawings.

DETAILED DESCRIPTION OF THE INVENTION

For clarity, the same elements have been designated by the same references in the different drawings and, further, as usual in the representation of integrated circuits, FIGS. 1, 2, 4A, 4B, 4B', 4C, and 4D are not to scale.

Figure 4A:
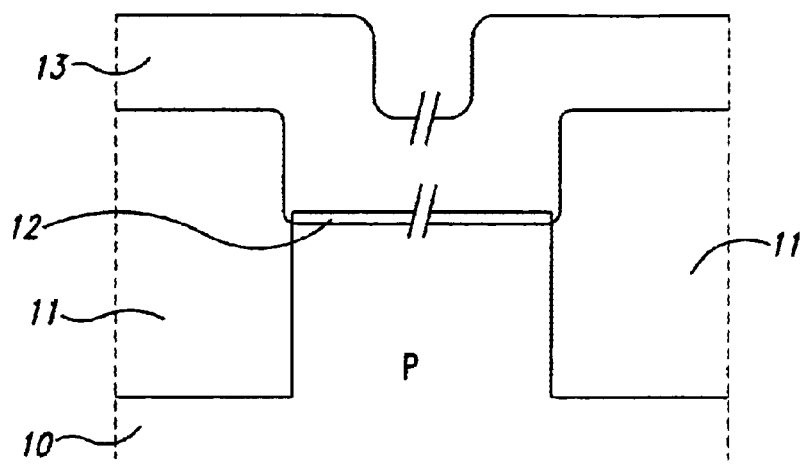
FIGS. 4A, 4B, 4B', 4C, and 4D illustrate in a simplified partial cross-section view an embodiment of the present invention.

The method according to an embodiment of the present invention starts with the definition of an active area in substrate 10, for example made of polysilicon, by an insulating area 11 (FIG. 4A).

Area 11 is formed by digging trenches into substrate 10, then filling them with an insulating material. Area 11 may be obtained by any conventional method. It will be, for example, the following step sequence: deposition of a mask, for example made of silicon nitride ($Si_3N_4$), typically having a thickness on the order of a few tens of nanometers, etching this mask to only leave it at the location of the active area, digging trenches at the location of the insulating layer, filling the trenches with an insulating material, planarizing by aligning on the level of the remaining portions of the mask, then removing the remaining mask.

In all cases, the insulating layer is formed so that the insulating material vertically extends beyond the trenches, whereby its upper surface is at a level higher than that of the active area. Area 11 thus has an edge extending beyond the surface of substrate 10 at the periphery of the active area.

Various state of the art cleaning steps are then implemented, after which a sacrificial layer 12 for protecting the active area is formed. Layer 12 is for example a thermal oxide grown over a thickness typically ranging between 5 and 15 nm, for example 10 nm.

A layer 13 of a material selectively etchable with respect to the insulating material of insulating layer 11 and with respect to sacrificial layer 12 is then deposited over the entire structure. Layer 13, which is for example insulating, preferably made of silicon nitride ($Si_3N_4$), has a thickness chosen as discussed hereafter. It should be noted that, after its deposition, layer 13 exhibits an overthickness at the level of the edge of insulating layer 11 at the periphery of the active area.

Figure 4B:
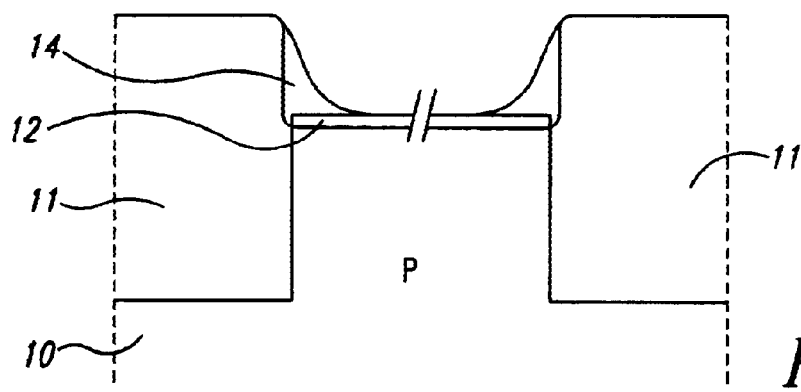
Figure 4B:
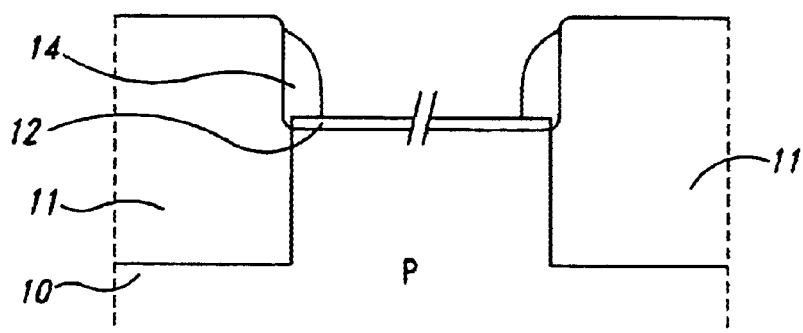

At the next steps, illustrated in FIGS. 4B and 4B', layer 13 is etched to remove it from the upper surface of areas 11. In this etching, during which the insulating materials of area 11 and of sacrificial layer 12 are used as an etch stop, a peripheral spacer 14 is left in place, due to the overthickness of layer 13 at the level of the edge between the upper surface of area 11 and the active area.

According to an embodiment illustrated in FIG. 4B, the etching of layer 13 is performed so that spacer 14 thins down from the edge of area 11 to the periphery of the active area towards the central portion thereof. Then, the portion of spacer 14 which is distal from the edge of area 11, instead of having a substantially vertical wall, is bell-shaped. Those skilled in the art will know how to implement etch methods adapted to modulating the thinning of the thickness of the lower portion of spacer 14. Those skilled in the art will also be able to choose the etch conditions and the thickness of thick insulating layer 13 to obtain a spacer 14 of desired width. It should be noted that the formed spacer 14 may also have a substantially vertical wall, as illustrated in FIG. 4B'.

Figure 4C:
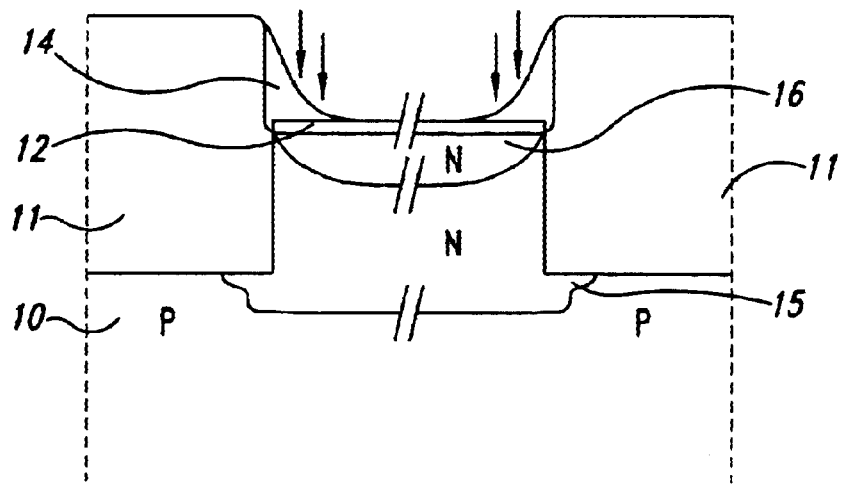

At the next steps, illustrated in FIG. 4C, the active area is implanted. In the illustrated example of formation of an N-channel MOS transistor, the substrate is of type P and the shown active area includes an N-type well. The implantation of the active area is performed while spacer 14 is in place at the periphery of the active area, as illustrated by the descending vertical arrows, whereby the implanted dopants are slowed down and penetrate less deeply into substrate 10 at the periphery, in the covered area of the spacer. According to known techniques, at least two successive implantations are performed a first high-energy implantation intended for forming a lightly-doped N-type well 15, reaching substrate 10 on a lower side of area 11, and at least one implantation at lower energy intended for more specifically adjusting the doping of the active area. Profile 16 resulting from this second implantation is modified at the periphery due to the presence of spacer 14. The region 16 substantially corresponds to an effective channel region.

It should be noted that spacer 14 can be maintained in place during the formation, in another active area, of wells of different type, for example type P. According to another embodiment, spacer 14 is only maintained in place during the forming of the N-type wells in the P-type substrate.

Figure 4D:
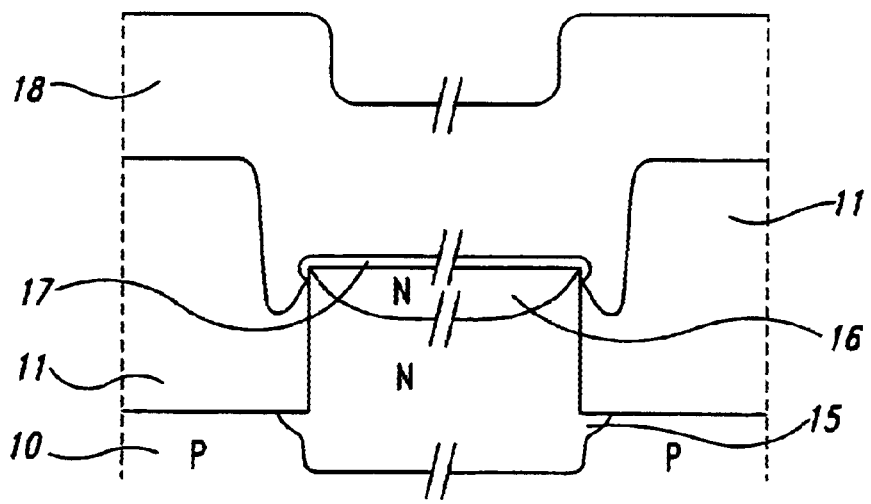

At the next steps, illustrated in FIG. 4D, the method continues with the removal of spacer 14. Then, the sequence of the following steps is conventional.

Thus, after cleaning steps that conventionally cause the forming of a depression of area 11 at the periphery of the active area, a gate insulator 17 is grown. Finally, a thick layer 18 of a conductive material, for example, polysilicon, is deposited and etched to form the structure gate. Layer 18 fills the depression of area 11.

Due to the modification of the profile of implanted region 16, the effects of the parasitic transistor upon the operation of the resulting transistor are considerably reduced.

Indeed, due to the fact that the edges of the active area have a dopant concentration closer to the surface, the threshold voltage of the parasitic transistor is thus raised, which compensates for the fall caused by the fact that the gate material fills up the peripheral depression of the active area. Thus, the resulting MOS transistor exhibits no lowering of its threshold voltage and its leakage current Ioff does not increase. Generally speaking, the features of the formed MOS transistor are not impaired and substantially correspond to those of the central transistor.

Further, the adverse influence of the peripheral parasitic transistor being considerably reduced, the dimensions of the active area may advantageously be decreased.

Another advantage of the present invention is to enable, after the doping of the active area, a planing down of the top of the insulating layer, which may even have a surface slightly under the substrate surface. Conversely to prior art, the enhancing of the depression of insulating layer 11 peripheral to the active area caused by such a planing down does not alter the features of the general transistor due to the modified doping profile. This enables a better planarization, which is useful in the subsequent steps of the integrated circuit manufacturing.

Figure 1:
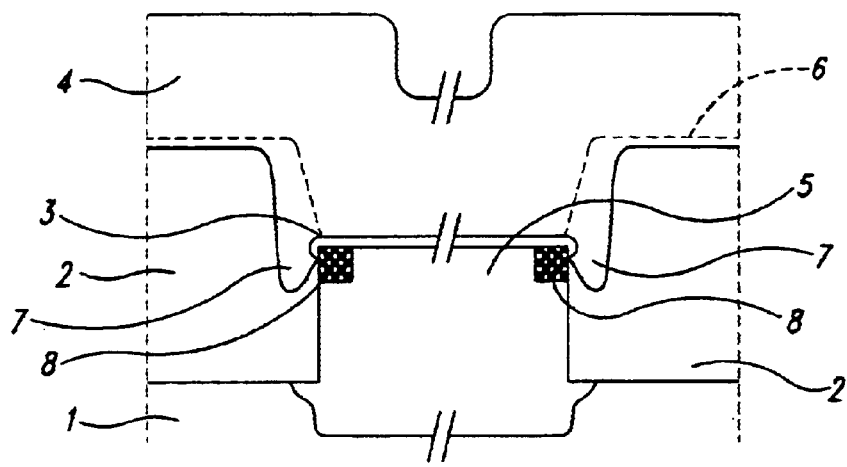
FIG. 1 illustrates in a simplified partial cross-section view an active area formed according to the state of the art.
Figure 2:
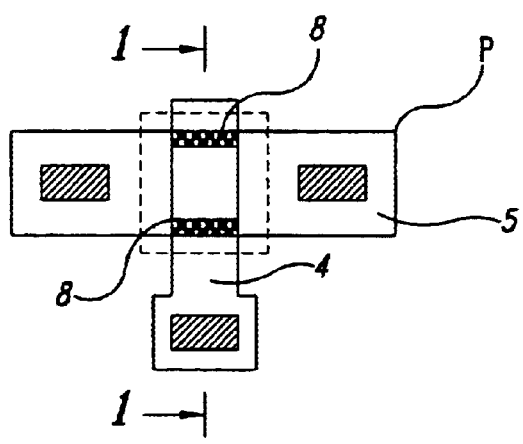
FIG. 2 illustrates in top view a lateral MOS transistor.
Figure 3:
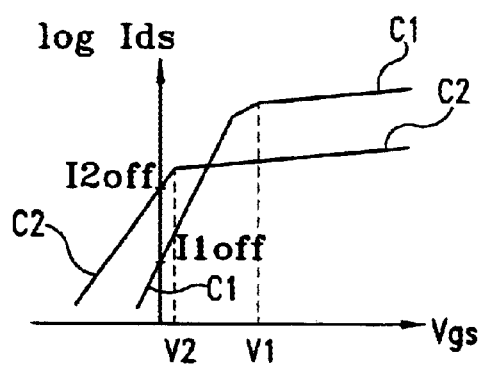
FIG. 3 illustrates the characteristic of the drain-source current as a function of the gate-source voltage of the transistor of FIG. 2.
Figure 5:
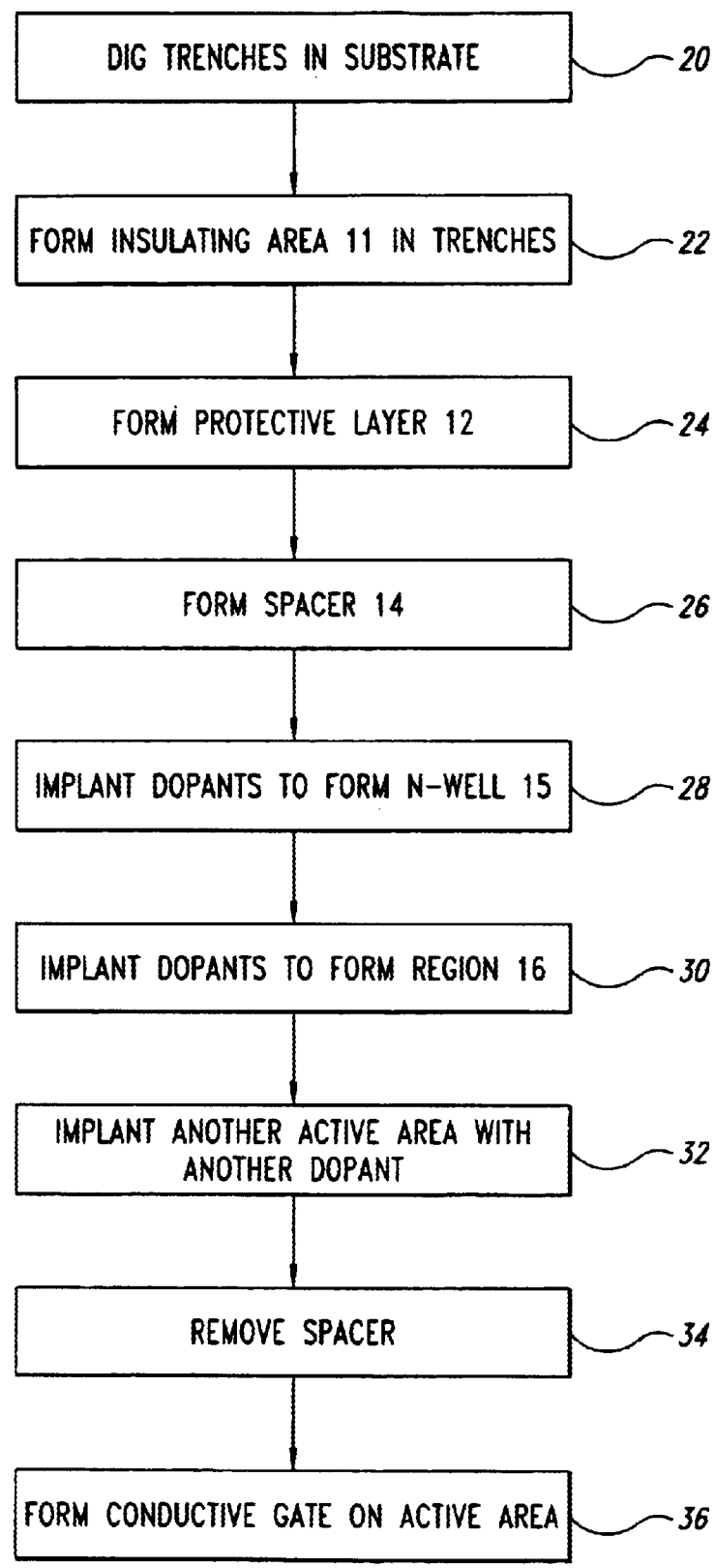
FIG. 5 is a flow diagram of a method according to an embodiment of the invention.

FIG. 5 is a flow diagram of a method according to an embodiment of the invention. The flow diagram summarizes many of the steps discussed above without adding new steps to those discussed above. Several of the blocks of the flow diagram include reference numbers that refers to elements of FIGS. 3–4D.

The method includes:

digging trenches in the substrate 1 (step 20);

forming insulating area 11 in the trenches (step 22);

forming the protective layer 12 (step 24);

forming the spacer 14 (step 26);

implanting dopants to form N-well 15 (step 28);

implanting dopants to form region 16 (step 30);

implanting another active area with dopants of another type (step 32);

removing the spacer 14 (step 34); and forming the conductive gate 18 on the active area (step 36).

Of course, the present invention is likely to have various alterations, modifications, and improvements which will readily occur to those skilled in the art. In particular, it has been previously assumed that layer 13 is made of an insulating material, preferably silicon nitride. Another material, insulating or not, may be chosen, provided that the previously-discussed selective etch conditions are fulfilled. It may for example be polysilicon or amorphous silicon.

Further, the principles of the present invention have been previously described and illustrated as applied to the forming of a MOS transistor. Those skilled in the art should however note that, generally, the present invention applies to the manufacturing of any type of device as soon as it includes an active area defined by insulating trenches.

Those skilled in the art will also know how to adapt the described materials to a specific manufacturing process and select the order of implementation of the various doping steps, as well as the doping levels of the various semiconductive layers according to the desired performances.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

We claim:

1. A method of forming a doped active area in a semiconductor substrate, comprising:

forming first and second insulation areas on a surface of the substrate, the first and second insulation areas being spaced apart from each other and thereby defining a substrate region of the substrate between the first and second insulation areas, the substrate region having a first peripheral portion immediately adjacent to the first insulation area and a central portion spaced apart from the first insulation area;

forming a spacer adjacent to the first insulation area and above the first peripheral portion of the substrate region;

performing, with the spacer positioned above the substrate, a high-energy first implant of first dopant type into the substrate region to create a well that extends in the substrate at a bottom side of the first insulation area; and performing, with the spacer positioned above the substrate, a low-energy second implant of the first dopant type into the substrate region to create the doped active area, the spacer acting as a mask to allow dopants of the second implant to extend deeper into the central portion that into the first peripheral portion.

2. The method of claim 1, further comprising forming a conductive gate on the active area after performing the first and second implants without implanting any dopants of other than the first dopant type in the active area prior to forming the conductive gate.

3. The method of claim 1, further comprising planarizing top surfaces of the insulating areas after performing the second implant.

* * * * *